United States Patent
Liu et al.

(10) Patent No.: US 8,809,123 B2
(45) Date of Patent: Aug. 19, 2014

(54) THREE DIMENSIONAL INTEGRATED CIRCUIT STRUCTURES AND HYBRID BONDING METHODS FOR SEMICONDUCTOR WAFERS

(75) Inventors: Ping-Yin Liu, Yonghe (TW); Xin-Hua Huang, Xihu Township (TW); Lan-Lin Chao, Sindian (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/488,745

(22) Filed: Jun. 5, 2012

(65) Prior Publication Data

US 2013/0320556 A1  Dec. 5, 2013

(51) Int. Cl.
*H01L 21/00* (2006.01)
(52) U.S. Cl.
USPC ............................. 438/118; 438/406; 438/455
(58) Field of Classification Search
CPC ....... H01L 23/31; H01L 23/488; H01L 25/50; H01L 25/065; H01L 25/0657
USPC .................. 438/118, 406, 455; 257/E21.499, 257/E21.567
See application file for complete search history.

(56) References Cited

U.S. PATENT DOCUMENTS

| | | | |
|---|---|---|---|
| 6,276,433 B1 * | 8/2001 | Gigliotti et al. | 164/122.1 |
| 7,385,283 B2 | 6/2008 | Wu et al. | |
| 2001/0020737 A1 | 9/2001 | Kwon et al. | |
| 2007/0145367 A1 * | 6/2007 | Chen et al. | 257/49 |
| 2007/0281438 A1 * | 12/2007 | Liu et al. | 438/455 |
| 2009/0140404 A1 * | 6/2009 | Chen et al. | 257/678 |
| 2010/0261332 A1 | 10/2010 | Kim et al. | |
| 2011/0027945 A1 * | 2/2011 | Saitou et al. | 438/125 |
| 2012/0126425 A1 * | 5/2012 | Farooq et al. | 257/774 |

FOREIGN PATENT DOCUMENTS

| | | |
|---|---|---|
| KR | 2001-0009429 A | 2/2001 |
| KR | 1020010071508 A | 7/2001 |
| KR | 1020080105956 A | 12/2008 |
| WO | 9965803 A1 | 12/1999 |

* cited by examiner

*Primary Examiner* — Long K Tran
(74) *Attorney, Agent, or Firm* — Slater and Matsil, L.L.P.

(57) ABSTRACT

Three dimensional integrated circuit (3DIC) structures and hybrid bonding methods for semiconductor wafers are disclosed. A 3DIC structure includes a first semiconductor device having first conductive pads disposed within a first insulating material on a top surface thereof, the first conductive pads having a first recess on a top surface thereof. The 3DIC structure includes a second semiconductor device having second conductive pads disposed within a second insulating material on a top surface thereof coupled to the first semiconductor device, the second conductive pads having a second recess on a top surface thereof. A sealing layer is disposed between the first conductive pads and the second conductive pads in the first recess and the second recess. The sealing layer bonds the first conductive pads to the second conductive pads. The first insulating material is bonded to the second insulating material.

20 Claims, 9 Drawing Sheets

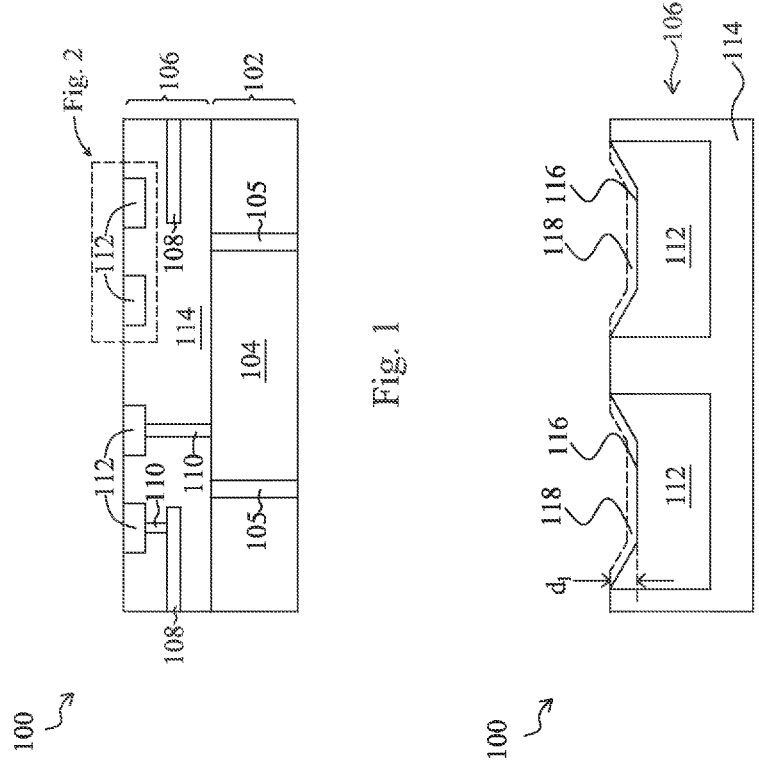

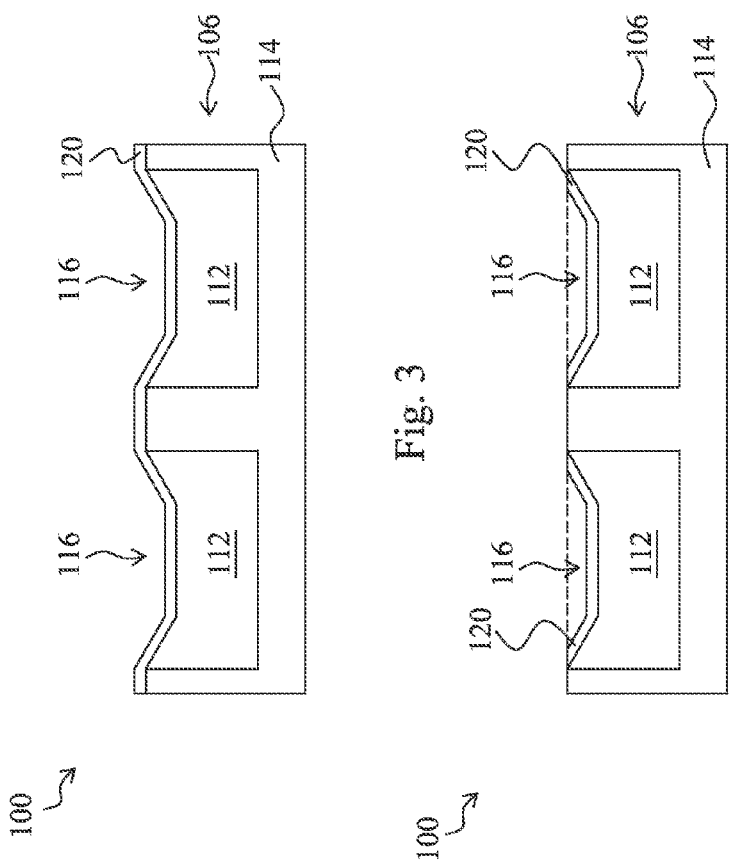

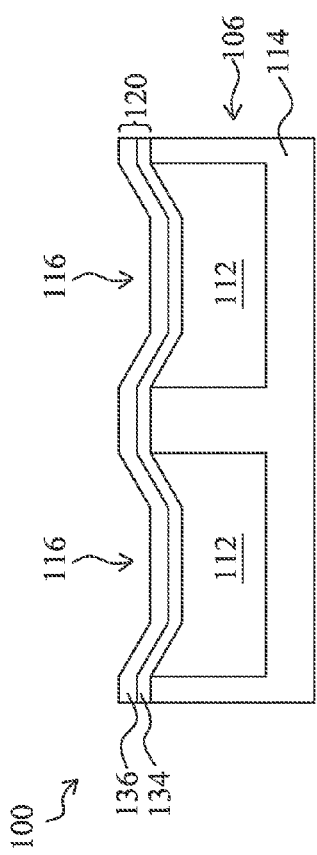
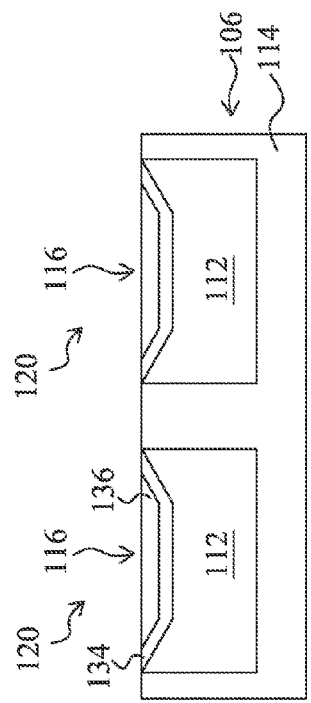

THREE DIMENSIONAL INTEGRATED CIRCUIT STRUCTURES AND HYBRID BONDING METHODS FOR SEMICONDUCTOR WAFERS

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. 3DICs provide improved integration density and other advantages, such as faster speeds and higher bandwidth, because of the decreased length of interconnects between the stacked dies, as examples.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 1 is a cross-sectional view of a portion of a semiconductor wafer in accordance with an embodiment of the present disclosure;

FIG. 2 through 6 are cross-sectional views illustrating a wafer-to-wafer hybrid bonding method in accordance with an embodiment at various stages;

FIG. 7 through 10 are cross-sectional views illustrating a method of hybrid bonding semiconductor wafers in accordance with another embodiment at various stages;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 5:
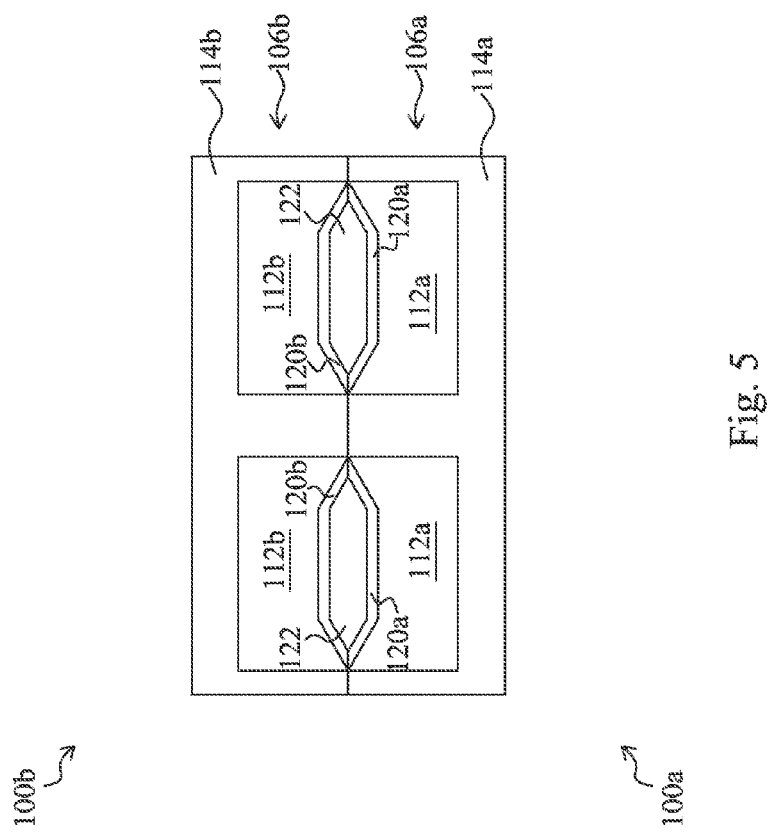

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to 3DIC packaging of semiconductor devices. Novel 3DIC structures and hybrid bonding methods for semiconductor wafers will be described herein. The hybrid bonding methods include forming non-metal to non-metal bonds using a fusion bonding and forming metal-to-metal bonds using a sealing layer that is heated to form eutectic metal bonds.

Referring first to FIG. 1, there is shown a cross-sectional view of a portion of a semiconductor wafer 100 in accordance with an embodiment of the present disclosure. Two or more semiconductor wafers such as the wafer 100 illustrated will be coupled together vertically using a novel hybrid bonding process in accordance with embodiments herein.

The semiconductor wafer 100 includes a workpiece 102. The workpiece 102 includes a semiconductor substrate comprising silicon or other semiconductor materials and may be covered by an insulating layer, for example. The workpiece 102 may comprise silicon oxide over single-crystal silicon, for example. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

The workpiece 102 may include a device region 104 formed proximate a top surface of the workpiece 102. The device region 104 includes active components or circuits, such as conductive features, implantation regions, resistors, capacitors and other semiconductor elements, e.g., transistors, diodes, etc. The device region 104 is formed over the workpiece 102 in a front-end-of-line (FEOL) process in some embodiments, for example. The workpiece 102 may also include through-substrate vias (TSVs) 105 comprising a conductive material that provide connections from a bottom side to a top side of the workpiece 102, as shown.

A metallization structure 106 is formed over the workpiece 102, e.g., over the device region 104 of the workpiece 102. The metallization structure 106 is formed over the workpiece 102 in a back-end-of-line (BEOL) process in some embodiments, for example. The metallization structure 106 includes conductive features, such as conductive lines 108, vias 110, and conductive pads 112 formed in an insulating material 114. The conductive pads 112 comprise contact pads or bond pads formed on a top surface of the semiconductor wafer 100, as examples. Some of the vias 110 couple conductive pads 112 to conductive lines 108 in the metallization structure 106, and other vias 110 couple contact pads 112 to the device region 104 of the workpiece 102. Vias 110 may also connect together conductive lines 108 in different metallization layers, not shown. The conductive features may comprise conductive materials typically used in BEOL processes, such as Cu, Al, W, Ti, TiN, Ta, TaN, or multiple layers or combinations thereof. In accordance with an embodiment, the conductive pads 112 disposed proximate a top surface of the metallization structure 106 comprise Cu or a copper alloy, for example. The metallization structure 106 shown is merely for illustrative purposes: the metallization structure 106 may comprise other configurations and may include one or more conductive line and via layers, for example. Some semiconductor wafers 100 may have three conductive line and via layers, or four or more conductive line and via layers, as other examples.

The semiconductor wafer 100 includes a plurality of semiconductor devices comprising portions of the workpiece 102 and the metallization layer 106 formed across the surface thereof, e.g., in a grid. The semiconductor devices comprise dies that may be shaped in a square or rectangular pattern in a top view of the workpiece 102, as examples.

FIG. 2 through 6 are cross-sectional views illustrating a method of hybrid bonding two semiconductor wafers 100 shown in FIG. 1 in accordance with an embodiment at various stages. FIG. 2 illustrates a more detailed view of a portion of the semiconductor wafer 100 shown in FIG. 1 that includes two conductive pads 112 disposed at the top surface of the metallization structure 106. The insulating material 114 comprises $SiO_2$, and the conductive pads 112 comprise Cu, in some embodiments. Alternatively, the insulating material 114 and the conductive pads 112 may comprise other materials.

The conductive pads 112 are formed in some embodiments using a damascene process, wherein the insulating material 114 is deposited over the workpiece 102, and the insulating material 114 is patterned using lithography. The patterned insulating material 114 is filled with a conductive material, and excess portions of the conductive material are removed from over the top surface of the insulating material 114 using a chemical mechanical polishing (CMP) process, an etch process, or combinations thereof. In other embodiments, a conductive material may be deposited and patterned using lithography, and the insulating material 114 is formed over the conductive material to form the conductive pads 112 using a subtractive etch process. The excess insulating material 114 is then removed from over the conductive pads 112 using a CMP process, an etch process, or combinations thereof.

In accordance with embodiments of the present disclosure, after the formation of the conductive pads 112, a CMP process is performed near an end of the fabrication process of the semiconductor wafer 100. The CMP process causes dishing of the conductive pads 112, forming recesses 116 in the top surface of the conductive pads 112, as shown. The top surface of the conductive pads 112 may be recessed beneath a top surface of the insulating material 114 by an amount comprising dimension $d_1$, wherein dimension $d_1$ comprises about 80 nm or less, as an example. Dimension $d_1$ of the recesses 116 of the conductive pads 112 may alternatively comprise other values. The recesses 116 may be deeper in central regions of the conductive pads 112, as shown. Wider conductive pads 112 may exhibit more dishing than narrower conductive pads 112, also illustrated in FIG. 2. Dimension $d_1$ may be larger for wider conductive pads 112 than for narrow conductive pads 112, for example.

The semiconductor wafer 100 may be placed in a fabrication facility in storage or on a shelf for a period of time after the manufacturing process is completed. During storage, an oxide material 118, shown in phantom in FIG. 2, may form on the top surface of the conductive pads 112. The oxide material 118 may comprise copper oxide ($CuO_x$) for example, by exposure of the Cu conductive pads 112 to oxygen in the ambient air. The oxide material 118 may begin forming soon after a final fabrication step, depending on the manufacturing environment, for example, because Cu oxidizes easily.

When it is time for the semiconductor wafer 100 to be packaged using a 3DIC process with another semiconductor wafer 100, the top surface of the wafer 100 is cleaned in order to remove at least a portion of the oxide material 118 from the top surface of the wafer 100, e.g., from the top surface of the conductive pads 112. All of the oxide material 118 is removed in some embodiments from over the top surface of the conductive pads 112 using the cleaning process, for example. The cleaning process may comprise a thermal treatment, a plasma treatment such as an $H_2$ plasma process, a wet treatment, a dry treatment, exposure to a gas comprising (about 4 to 10% $H_2$)/(about 90 to 96% inert gas or $N_2$), exposure to a gas comprising about 100% $H_2$, an introduction of an acid such as HCOOH, or combinations thereof, as examples. If the cleaning process comprises exposure to a gas comprising (about 4 to 10% $H_2$)/(about 90 to 96% inert gas), the cleaning process may comprise using about 4 to 10% of $H_2$ mixed with a forming gas comprising about 90 to 96% of an inert gas, such as He or Ar, as examples. Alternatively, the cleaning process may comprise other types of chemistries and cleaning techniques. There is little or no change in surface roughness of the wafer 100 after the $CuO_x$ reduction process in accordance with embodiments, e.g., having a root mean square (RMS) of less than about 5 Angstroms, as an example.

Next, a sealing layer 120 is formed over the top surface of the semiconductor wafer 100, as shown in FIG. 3. The sealing layer 120 comprises a material that comprises at least one component of a eutectic metal in accordance with embodiments of the present disclosure. The sealing layer 120 comprises about 50 nm or less of Ge or Sn in this embodiment. The sealing layer 120 is formed using chemical vapor deposition (CVD), physical vapor deposition (PVD), or electroplating, as examples. The sealing layer 120 may alternatively comprise other dimensions and materials and may be formed using other methods. The sealing layer 120 substantially conforms to the topography of the top surface of the semiconductor wafer 100, lining the recesses 116 in the conductive pads 112, as shown.

The sealing layer 120 comprises a material having properties such that when the sealing layer 120 is combined with the material of the conductive pads 112 and heated to a predetermined temperature, a metal in a eutectic phase is formed. If the conductive pads 112 comprise Cu, the combination of (Cu+Ge) has a eutectic phase in a certain chemical composition and when heated to a certain temperature, at a eutectic point, the combination of (Cu+Ge) reacts and melts or liquefies to form CuGe. Similarly, the combination of (Cu+Sn) has a eutectic phase.

Alternatively, the sealing layer 120 may comprise other materials or elements that produce a eutectic metal combined with the material of the conductive pads 112 in accordance with embodiments of the present disclosure. In some embodiments, the sealing layer 120 comprises a first component of a eutectic metal, and the conductive pads 112 comprise a second component of the eutectic metal. When the first component and the second component of the eutectic metal are heated at the eutectic point temperature for the eutectic metal, the first component and the second component react and liquefy or melt, and then return to a solid when the temperature is decreased, forming the eutectic metal.

Next, the sealing layer 120 is removed from over the top surface of the insulating material 114, as shown in FIG. 4. The sealing layer 120 is removed using a CMP method, an etch method, or a combination thereof, for example, although alternatively, the sealing layer 120 may be removed by other methods. A small portion, e.g., a few nm, of the sealing layer 120 within the recesses 116 may also be removed when removing the sealing layer 120 from over the top surface of the insulating material 114. A portion of the sealing layer 120 is left remaining in the recesses 116 on the top surfaces of the conductive pads 112, as shown.

In some embodiments, the sealing layer 120 left remaining in the recesses 116 completely fills the recesses 116 after removing the sealing layer 120 from the top surfaces of the insulating material 114, as shown in phantom in FIG. 4. The sealing layer 120 left remaining in the recesses 116 in the top surfaces of the conductive pads 112 seals gaps between conductive pads 112 of the semiconductor wafers 100 when the wafers 110 are bonded together using the hybrid bond methods of the present disclosure, in these embodiments, for example. Across a surface of a wafer 100, some conductive pads 112 may have recesses 116 that are completely filled with the sealing layer 120, and other conductive pads 112 may have recesses 116 that are partially filled with the sealing layer 120, after removing the sealing layer 120 from over the insulating material 114.

Two semiconductor wafers 100 are then bonded together using a hybrid bonding process, by coupling a top surface of one semiconductor wafer to a top surface of another semiconductor wafer, as shown in FIG. 5. The wafers comprise a first semiconductor wafer 100a and a second semiconductor wafer 100b that have been processed using the procedures described herein for FIG. 1 through 4. The top surface of the second semiconductor wafer 100b is coupled to the top surface of the first semiconductor wafer 100a. The second semiconductor wafer 100b is inverted, i.e., rotated by about 180 degrees, from the view shown in FIG. 4, for example.

Before the wafers 100a and 100b are coupled together, the top surfaces of the first semiconductor wafer 100a and the second semiconductor wafer 100b may be activated in some embodiments, after removing the sealing layer 120 from over the insulating materials 114a and 114b of the first semiconductor wafer 100a and the second semiconductor wafer 100b, respectively. Activating the top surfaces of the first semiconductor wafer 100a and the second semiconductor wafer 100b may comprise a dry treatment, a wet treatment, a plasma treatment, exposure to an inert gas, exposure to $H_2$, exposure to $N_2$, exposure to $O_2$, or combinations thereof, as examples. In embodiments where a wet treatment is used, an RCA cleaning may be used, for example. Alternatively, the activation process may comprise other types of treatments. The activation process assists in the hybrid bonding of the first semiconductor wafer 100a and the second semiconductor wafer 100b, advantageously allowing the use of lower pressures and temperatures in subsequent hybrid bonding processes. After the activation process, the wafers 100a and 100b may then be cleaned using a chemical rinse. There is little or no change in surface roughness of the wafers 100a and 100b after the activation process in accordance with embodiments, e.g., having a RMS of less than about 5 Angstroms, as an example.

The bonding of the second semiconductor wafer 100b to the first semiconductor wafer 100a is achieved by aligning the conductive pads 112b having the sealing layer 120b formed thereon on the second semiconductor wafer 100b with the conductive pads 112a having the sealing layer 120a formed thereon on the first semiconductor wafer 100a, as shown in FIG. 5. The alignment of the wafers 100a and 100b may be achieved using optical sensing, as an example. Apertures 122 may form between the sealing layers 120a and 120b on the top surfaces of the conductive pads 112a and 112b, as shown. Top surfaces of the insulating material 114b of the second semiconductor wafer 100b are also aligned with top surfaces of the insulating material 114a of the first semiconductor wafer 100a.

Figure 6:
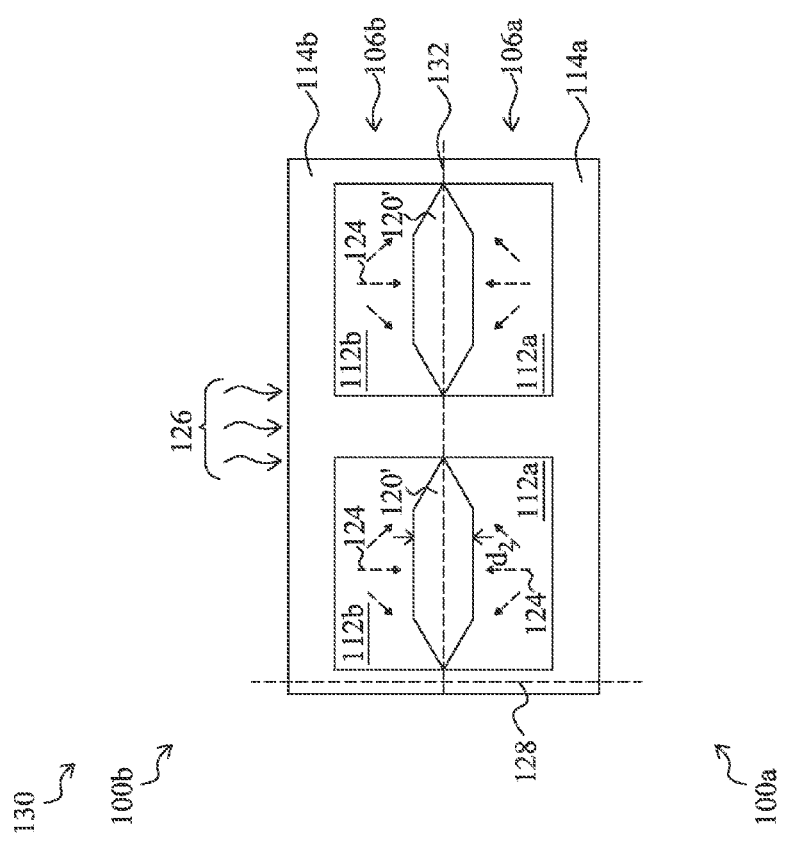

Referring next to FIG. 6, the insulating materials 114a and 114b are bonded using a fusion bonding process at a low pressure and low temperature. A pressure 124 of about 200 kPa or less is applied to the first semiconductor wafer 100a and the second semiconductor wafer 100b to form a bond 132 between the top surfaces of the insulating materials 114a and 114b, in some embodiments. The semiconductor wafers 100a and 100b may also be heated at a low temperature of about 200 to 400 degrees C. or less when forming the bond 132 between the insulating materials 114a and 114b, for example.

Alternatively, other pressures 124 and temperatures may be used for the fusion bonding of the insulating materials 114a and 114b. The pressure 124 forms a non-metal to non-metal bond 132 at the interface of the insulating material 114a and 114b of the wafers 100a and 100b.

After the insulating materials 114a and 114b are bonded, the conductive pads 112a and 112b of the wafers 100a and 100b are bonded with a metal-to-metal bond using the sealing layers 120a and 120b, by applying heat 126 to the wafers 100a and 100b at a temperature that is at or above the eutectic point for the materials of the conductive pads 112a and 112b and the sealing layers 120a and 120b. The heat 126 may be applied using a thermal anneal process or other heating technique. The heat 126 process comprises heating the first semiconductor wafer 100a and the second semiconductor wafer 100b to a temperature of about 150 to 650 degrees C., for example, in some embodiments, although alternatively, other temperatures may be used. In an embodiment wherein the conductive pads 112a and 112b comprise Cu and the sealing layers 120a and 120b comprise Ge, the heat 126 applied comprises a temperature of about 630 degrees C., as one example. The eutectic point of CuGe is about 627 degrees C. at a composition of about 0.41 mole Ge/(Cu+Ge), and thus heating the wafers 100a and 100b to this temperature causes Cu from the conductive pads 112a and 112b to react with Ge of the sealing layers 120a and 120b and form CuGe in a liquid form, for example. When the heat 126 is removed and the wafers 100a and 100b are cooled, the CuGe hardens and becomes a solid, forming a sealing layer 120' shown in FIG. 6 comprising the eutectic metal (e.g., that comprises the CuGe). The heat 126 applied may alternatively comprise other temperatures and temperature ranges.

When sealing layers 120a and 120b react with the material of the conductive pads 112a and 112b at the eutectic point, the resulting liquid sealing layer 120' formed closes the apertures 122 or gaps between the sealing layers 120a and 120b. The sealing layers 120a and 120b and material from the conductive pads 112a and 112b form a single sealing layer 120' when the temperature is lowered that is comprised of the material of both sealing layers 120a and 120b and a top portion of the conductive pads 112a and 112b. The sealing layer 120' comprises a bond region between conductive pads 112a and 112b of the first and second semiconductor wafers 100a and 100b, for example. The sealing layer 120' enhances the mechanical strength and closes the apertures 122 that previously were disposed between the sealing layers 120a and 120b on the top surfaces of the conductive pads 112a and 112b. The resulting sealing layer 120' comprises a eutectic metal that forms a metal-to-metal bond for the conductive pads 112a and 112b. In the embodiment shown, the sealing layer 120' comprises a eutectic metal comprising CuGe or CuSn: Cu from the conductive pads 112a and 112b combines with the Ge or Sn of the sealing layer 120a and 120b to form the CuGe or CuSn during the application of the heat 126.

The resulting 3DIC structure 130 includes the stacked and bonded first and second semiconductor wafers 100a and 100b. The first and second semiconductor wafers 100a and 100b are then sawed along scribe lines 128 that are arranged in a grid shape in a top view, and the packaged 3DIC semiconductor devices on the wafers 100a and 100b are separated from one another (not shown).

The sealing layer 120' that functions as a bond between conductive pads 112a and 112b of two wafers 100a and 100b bonded together also reduces contact resistance by closing the apertures 122 (see FIG. 5) or gaps between conductive pads 112a and 112b. The sealing layer 120' also prevents oxidation of the top surfaces of the conductive pads 112a and 112b, preventing the formation of $CuO_x$ in some embodiments, advantageously.

FIGS. 7 through 10 are cross-sectional views illustrating a method of hybrid bonding semiconductor wafers 100a and 100b in accordance with another embodiment at various stages. This embodiment is similar to the embodiment shown in FIG. 2 through 6, yet a material of the conductive pads 112a and 112b is not used as a component of the eutectic metal of the sealing layer 120'. Rather, a sealing layer 120 is formed over the top surfaces of the first semiconductor wafer 100a and the second semiconductor wafer 100b that comprises two layers: a first layer 134 comprising a material such as Al that is formed over the top surfaces of the first semiconductor wafer 100a and the second semiconductor wafer 100b (shown as semiconductor wafer 100 in FIG. 7), and a second layer 136 disposed over the first layer 134, the second layer 136 comprising a material such as Ge. The first layer 134 and the second layer 136 will combine upon being heated to a eutectic point to form a sealing layer 120' comprising a eutectic metal, e.g., AlGe, in this embodiment. The first layer 134 and the second layer 136 may be formed using similar methods and comprising similar dimensions described for the sealing layer 120 of the previous embodiment, for example.

The first layer 134 and the second layer 136 may alternatively comprise other materials that when combined at the eutectic point, at the eutectic temperature and eutectic chemical composition, will form a eutectic metal in this embodiment. The first layer 134 comprises a first component of the eutectic metal, and the second layer 136 comprises a second component of the eutectic metal, in some embodiments, for example.

The sealing layer 120 is removed from over the top surface of the insulating material 114, as shown in FIG. 8 and as described for FIG. 4. A small portion of the sealing layer 120 within the recesses 116 may also be removed when removing the sealing layer 120 from over the top surface of the insulating material 114. A portion of the sealing layer 120 is left remaining in the recesses 116 on the top surfaces of the conductive pads 112a and 112b. In some embodiments, the sealing layer 120 completely fills the recesses 116, as shown in FIG. 8.

Figure 9:
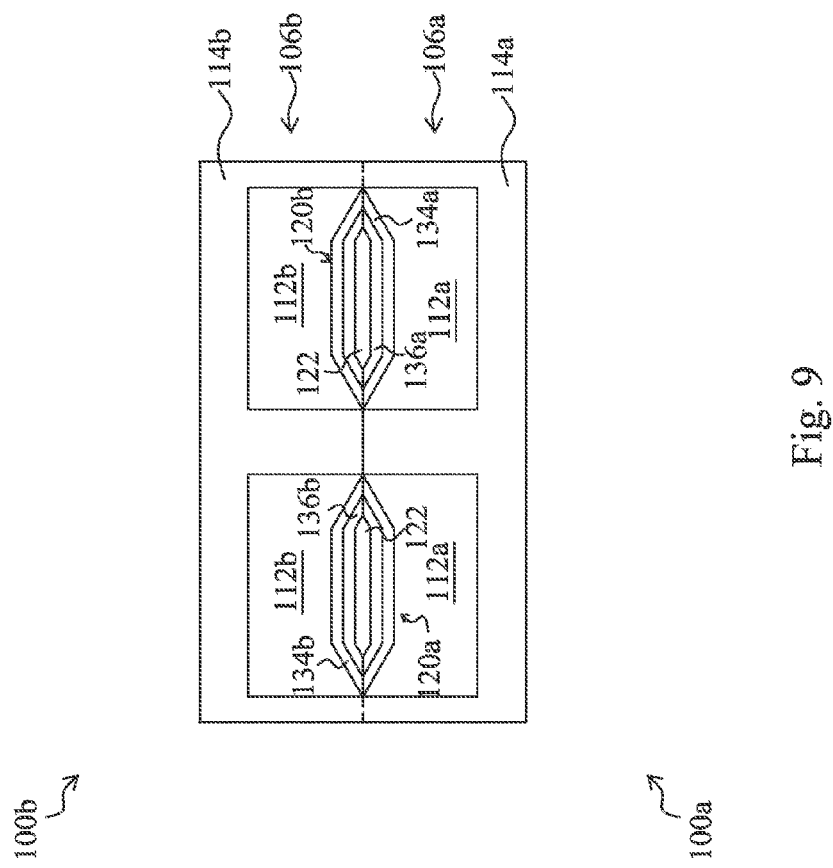

Two semiconductor wafers 100 are then bonded together using the hybrid bonding process previously described herein, by coupling a top surface of one semiconductor wafer to a top surface of another semiconductor wafer, as shown in FIG. 9. The wafers comprise a first semiconductor wafer 100a and a second semiconductor wafer 100b that have been processed using the procedures described herein for FIGS. 1, 2, 7, and 8. The top surface of the second semiconductor wafer 100b is coupled to the top surface of the first semiconductor wafer 100a. Before the wafers 100a and 100b are coupled together, the top surfaces of the first semiconductor wafer 100a and the second semiconductor wafer 100b may be activated in some embodiments, as previously described herein.

Figure 10:
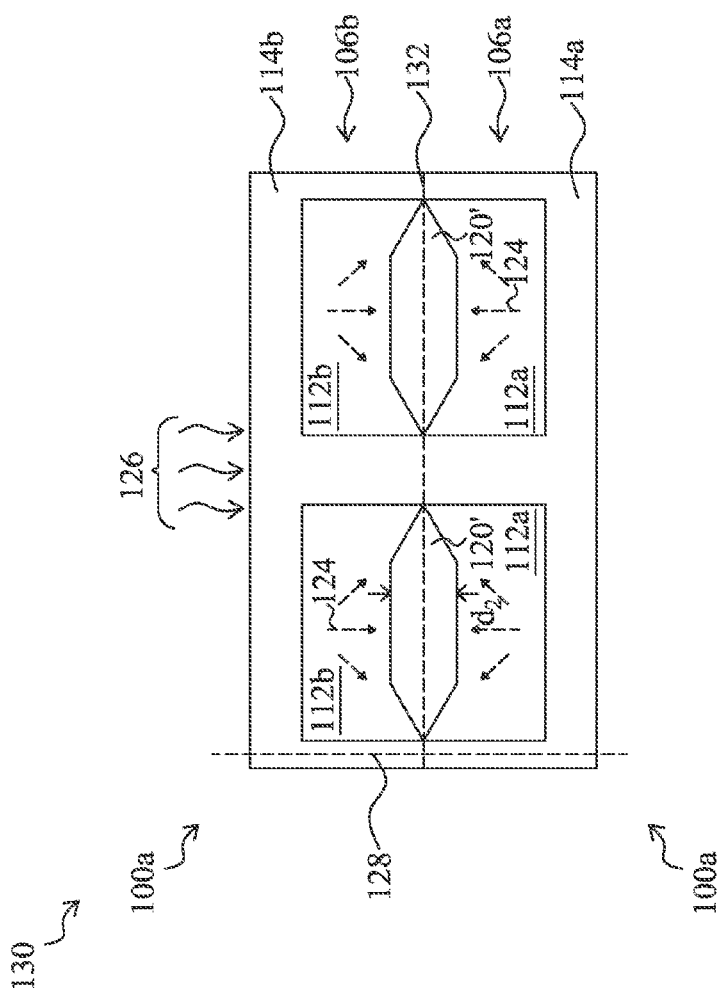

The second semiconductor wafer 100b is aligned with the first semiconductor wafer 100a. Apertures 122 may form between the sealing layers 120a and 120b on the top surfaces of the conductive pads 112a and 112b. The insulating materials 114a and 114b of the wafers 100a and 100b are bonded using a fusion bonding process by applying pressure 124, forming a bond 132 between the top surfaces of the insulating materials 114a and 114b, as shown in FIG. 10. Heat 126 is applied to the first semiconductor device 100a and the second semiconductor wafer 100b, causing the first layer 134 and the second layer 136 of the sealing layer 120 to react and liquefy, forming a single sealing layer 120' comprising a eutectic metal and closing the apertures 122 between the sealing layers 120a and 120b on the top surfaces of the conductive pads 112a and 112b. In the embodiment wherein the first layer 134 comprises Al and the second layer 136 comprises Ge, the heat 126 applied comprises a temperature of about 430 degrees C. to form a sealing layer 120' comprising AlGe, as another example. The eutectic point of AlGe is about 427 degrees C. at a composition of about 0.28 mole Ge/(Al+Ge), for example.

The sealing layer 120' provides a metal-to-metal bond between the conductive pads 112a and 112b of the first and second semiconductor wafers 100a and 100b, forming a 3DIC structure 130. The stacked and bonded first and second semiconductor wafers 100a and 100b are then sawed along scribe lines 128, and the packaged 3DIC dies on the wafers 100a and 100b are separated from one another.

Figure 11:
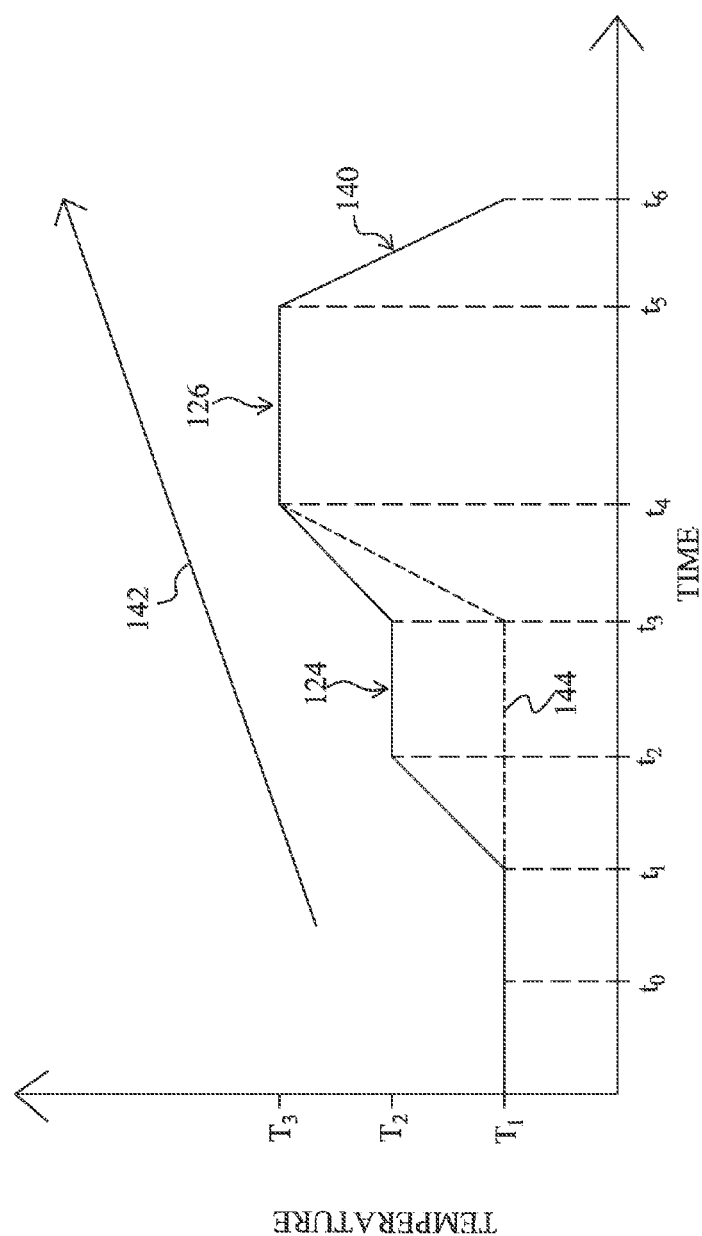
FIG. 11 is a graph illustrating temperatures of the hybrid bonding method over time in accordance with an embodiment.

FIG. 11 is a graph 140 illustrating temperatures $T_1$, $T_2$, and $T_3$ of the hybrid bonding process over time in accordance with an embodiment. The bond strength 142 increases during the hybrid bonding process as a result of the temperatures $T_1$, $T_2$, and $T_3$ and pressures 124 applied. At time $t_0$, alignment of the wafers 100a and 100b is performed at a temperature $T_1$ comprising room temperature, which is typically about 25 degrees C. $T_1$ may also comprise other values. The initial interface reaction at temperature $T_1$ results the formation of hydrogen bonds between the insulating materials 114a and 114b of the wafers 100a and 100b, for example.

At time $t_1$, the temperature is raised until temperature $T_2$ is reached at time $t_2$. Temperature $T_2$ comprises the temperature applied when applying the pressure 124 to form bonds between the insulating materials 114a and 114b. Temperature $T_2$ comprises a temperature of about 200 to 400 degrees C. or less in some embodiments, for example, as previously described herein. The pressure 124 and temperature $T_2$ applied causes an interface reaction that forms covalent bonds between the insulating materials 114a and 114b. The hydrogen bonds formed at temperature $T_1$ are converted to covalent bonds, for example. The pressure 124 and temperature $T_2$ applied also increases contact between the metal layers comprising conductive pads 112a and 112b and sealing layers 120a and 120b. In some embodiments, no heat is applied during the application of the pressure 124, and the temperature remains at temperature $T_1$, as illustrated in the graph 140 in phantom at 144.

At time $t_3$, the temperature is raised until temperature $T_3$ is reached at time $t_4$. Temperature $T_3$ comprises the temperature applied when applying the heat 126 previously described herein. The heat 126 process may comprise heating the first semiconductor wafer 100a and the second semiconductor wafer 100b to a temperature $T_3$ of about 150 to 650 degrees C., for example. Applying the heat 126 at temperature $T_3$ causes an interface reaction comprising the eutectic bond formed by the sealing materials 120a and 120b that, after melting, seals the apertures 122 between the conductive pads 112a and 112b. Temperature $T_3$ comprises the eutectic reaction temperature of the sealing materials 120a and 120b, for example. The heat 126 is applied at temperature $T_3$ for a predetermined period until time $t_5$, when the temperature is allowed to return to room temperature $T_1$ at time $t_6$, and the hybrid bonding process of the wafers 100a and 100b is completed.

Figure 12:
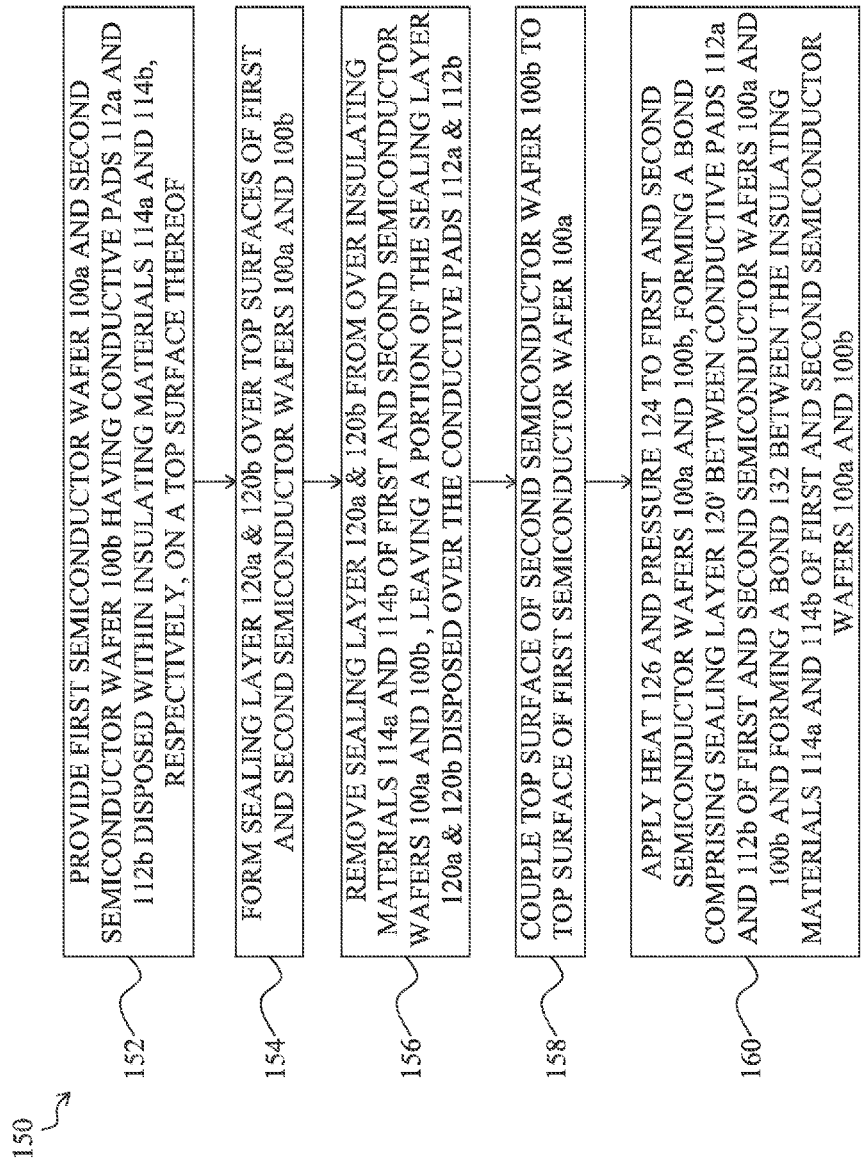
FIG. 12 is a flow chart of a method of forming a 3DIC structure using a hybrid bonding process in accordance with an embodiment.

FIG. 12 is a flow chart 150 of a method of forming a 3DIC structure 150 using a hybrid bonding process described herein in accordance with an embodiment. In step 152, a first semiconductor wafer 100a and a second semiconductor wafer 100b are provided that have conductive pads 112a and 112b disposed within insulating materials 114a and 114b, respectively, on a top surface thereof. In step 154, a sealing layer 120*a* and 120*b* is formed over top surfaces of the first and second semiconductor wafers 100*a* and 100*b*. In step 156, the sealing layer 120*a* and 120*b* is removed from over insulating materials 114*a* and 114*b* of first and second semiconductor wafers 100*a* and 100*b*, leaving a portion of the sealing layer 120*a* and 120*b* disposed over the conductive pads 112*a* and 112*b*. In step 158, the top surface of the second semiconductor wafer 100*b* is coupled to the top surface of the first semiconductor wafer 100*a*. Heat 126 and pressure 124 are applied to the first and second semiconductor wafers 100*a* and 100*b* in step 160, forming a bond comprising sealing layer 120' between the conductive pads 112*a* and 112*b* of the first and second semiconductor wafers 100*a* and 100*b* and forming a bond 132 between the insulating materials 114*a* and 114*b* of the first and second semiconductor wafers 100*a* and 100*b*.

Three or more semiconductor wafers 100, 100*a*, and 100*b* may be stacked vertically and hybrid bonded using the methods described herein. Exposed ends of TSVs 105 of the workpiece 102 (see FIG. 1) may be coupled to conductive pads 112 on another semiconductor wafer 100, 100*a*, or 100*b* using the sealing layer 120' comprising the eutectic metal formed in recesses of the conductive pads 112 and TSVs 105, for example. Alternatively, an additional connecting layer including conductive pads 112 may be formed over exposed ends of the TSVs 105, which may be used to hybrid bond to another wafer 100, 100*a*, or 100*b*, as another example.

If a CMP process is not included in a manufacturing process flow for the conductive pads 112 of the wafer 100 shown in FIG. 1, a CMP process may be added to the process flow to form the recesses 116, so that there is space for the sealing layers 120 and 120' described herein to be formed. If a CMP process is included in the process flow, but the recesses 116 formed are not large enough to form a sufficient bond of the sealing layer 120', the existing CMP process can be lengthened or the chemistries of the CMP process may be changed to form recesses 116 of a desired depth.

One or more semiconductor devices on the second semiconductor wafer 100*b* is hybrid bonded to each semiconductor device on the first semiconductor wafer 100*a* using the hybrid bonding process described herein. The semiconductor devices on the semiconductor wafers 100, 100*a* and 100*b* may include a device type such as a semiconductor die, an electrical circuit, a photo diode, a micro-electrical-mechanical system (MEMS) device, a bio-sensing device, a complementary metal oxide (CMOS) device, a digital image sensor, an application specific integrated circuit (ASIC) device, or combinations thereof, as examples. One semiconductor wafer 100*a* may comprise a plurality of dies, with each die comprising a processor, and the other semiconductor wafer 100*b* may comprise one or more memory devices that are coupled to and packaged with each of the processors on the other semiconductor wafer 100*a*, as one example. In other embodiments, one semiconductor wafer 100*b* may comprise digital image sensors including a plurality of photo diodes formed thereon, and the other semiconductor wafer 100*a* may comprise dies having support circuitry thereon for the digital image sensors, as another example. The support circuitry may comprise ASIC devices, for example. One wafer 100*b* may be adapted to enhance photosensitivity in another wafer 100*a*, in other embodiments. Other combinations of types of semiconductor wafers 100, 100*a*, and 100*b* and semiconductor devices may be packaged together in a 3DIC structure in accordance with embodiments herein, using the novel hybrid bonding methods described herein, depending on the application.

Embodiments of the present disclosure include methods of hybrid bonding semiconductor wafers to form 3DIC structures 130, and also include 3DIC structures 130 packaged using the hybrid bonding methods described herein. In some embodiments, the plurality of conductive pads of the first semiconductor wafer and the second semiconductor wafer comprise Cu, and the insulating materials of the first semiconductor wafer and the second semiconductor wafer comprise $SiO_2$, wherein the hybrid bonding methods described herein comprise a $Cu/SiO_2$ wafer level hybrid bonding process.

Advantages of embodiments of the disclosure include providing novel hybrid bonding methods that lower contact resistance of the bonds of the conductive pads 112*a* and 112*b*. The sealing layers 120' provide the bonds between the conductive pads 112*a* and 112*b*, close apertures 122 between the conductive pads 112*a* and 112*b*, and prevent the formation of $CuO_x$. The sealing layers 120' also enhance the mechanical strength of the 3DIC structures 130. Dishing and erosion of top surfaces of the conductive pads 112*a* and 112*b* during CMP processes are not problematic in the novel hybrid bonding methods and 3DIC structures 130, because the sealing layers 120' function as a dishing compensation layer. A high accuracy in alignment of the wafers 100*a* and 100*b* in the hybrid bonding process is achieved. Lower forces may be used for the thermo-compression bonding used to bond the insulating materials 114*a* and 114*b*, preventing the introduction of stress to and distortion of the semiconductor devices on the wafers 100*a* and 100*b*.

In embodiments wherein a top layer of Ge (e.g., a sealing layer 120 comprising Ge or a second layer 136 of the sealing layer 120 comprising Ge) is included, the sealing layer 120 also functions as a protection layer. When Ge is oxidized, $GeO_x$ is formed, which is easily removed by a wet process (e.g., using water or chemicals) or a dry process (e.g., plasma). Furthermore, the presence of the top layer of Ge prevents the formation of $CuO_x$.

The hybrid bonding methods described herein are advantageously compatible with complementary metal oxide semiconductor (CMOS) processes and materials. The novel 3DIC structures 130 and hybrid bonding methods are easily implementable in semiconductor device packaging process flows.

In accordance with one embodiment of the present disclosure, a 3DIC structure includes a first semiconductor device having a plurality of first conductive pads disposed within a first insulating material on a top surface thereof, each of the plurality of first conductive pads having a first recess on a top surface thereof. The 3DIC structure includes a second semiconductor device having a plurality of second conductive pads disposed within a second insulating material on a top surface thereof coupled to the first semiconductor device, each of the plurality of second conductive pads having a second recess on a top surface thereof. A sealing layer is disposed between each of the plurality of first conductive pads and one of the plurality of second conductive pads in the first recess and the second recess. The sealing layer bonds each of the plurality of first conductive pads to the one of the plurality of second conductive pads. The first insulating material is bonded to the second insulating material.

In accordance with another embodiment, a hybrid bonding method for semiconductor wafers includes providing a first semiconductor wafer and a second semiconductor wafer. The first semiconductor wafer and the second semiconductor wafer each have a plurality of conductive pads disposed within an insulating material on a top surface thereof. A sealing layer is formed over the top surfaces of the first semiconductor wafer and the second semiconductor wafer.

The sealing layer is removed from over the insulating materials of the first semiconductor wafer and the second semiconductor wafer, leaving a portion of the sealing layer disposed over the plurality of conductive pads of the first semiconductor wafer and the second semiconductor wafer. The top surface of the second semiconductor wafer is coupled to the top surface of the first semiconductor wafer. Heat and pressure are applied to the first semiconductor wafer and the second semiconductor wafer. Applying the pressure forms a bond between the insulating material of the first semiconductor wafer and the insulating material of the second semiconductor wafers. Applying the heat forms a bond between the plurality of conductive pads of the first semiconductor wafer and the plurality of conductive pads of the second semiconductor wafer.

In accordance with yet another embodiment, a hybrid bonding method for semiconductor wafers includes providing a first semiconductor wafer and a second semiconductor wafer, the first semiconductor wafer and the second semiconductor wafer each having a plurality of conductive pads disposed within an insulating material on a top surface thereof. The method includes performing a CMP process on the top surfaces of the first semiconductor wafer and the second semiconductor wafer, wherein the CMP process forms recesses on top surfaces of the plurality of conductive pads. The top surfaces of the first semiconductor wafer and the second semiconductor wafer are cleaned, and a sealing layer is formed over the top surfaces of the first semiconductor wafer and the second semiconductor wafer. The sealing layer is removed from over the insulating material of the first semiconductor wafer and the second semiconductor wafer, leaving the sealing layer remaining in the recesses on the top surfaces of the plurality of conductive pads of the first semiconductor wafer and the second semiconductor wafer. The top surface of the second semiconductor wafer is coupled to the top surface of the first semiconductor wafer. Pressure is applied to the first semiconductor wafer and the second semiconductor wafer to form a bond between the insulating materials of the first semiconductor wafer and the second semiconductor wafer. The first semiconductor wafer and the second semiconductor wafer are heated to form a bond comprised of the sealing layer between the plurality of conductive pads of the first semiconductor wafer and the second semiconductor wafer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A hybrid bonding method for semiconductor wafers, the method comprising:
   providing a first semiconductor wafer and a second semiconductor wafer, the first semiconductor wafer and the second semiconductor wafer each having a plurality of conductive pads disposed within an insulating material on a top surface thereof;
   forming a sealing layer over the top surfaces of the first semiconductor wafer and the second semiconductor wafer;
   removing the sealing layer from over the insulating materials of the first semiconductor wafer and the second semiconductor wafer, leaving a portion of the sealing layer disposed over the plurality of conductive pads of the first semiconductor wafer and the second semiconductor wafer;
   coupling the top surface of the second semiconductor wafer to the top surface of the first semiconductor wafer; and
   applying heat and pressure to the first semiconductor wafer and the second semiconductor wafer, wherein applying the pressure forms a bond between the insulating material of the first semiconductor wafer and the insulating material of the second semiconductor wafers, and wherein applying the heat forms a bond comprising the sealing layer between the plurality of conductive pads of the first semiconductor wafer and the plurality of conductive pads of the second semiconductor wafer.

2. The method according to claim 1, wherein removing the sealing layer from over the insulating materials of the first semiconductor wafer and the second semiconductor wafer comprises a method selected from the group consisting essentially of a chemical-mechanical polish (CMP) method, an etch method, and combinations thereof.

3. The method according to claim 1, wherein forming the sealing layer comprises forming a first component of a eutectic metal, wherein the plurality of conductive pads of the first semiconductor wafer and the second semiconductor wafer comprises a second component of the eutectic metal, wherein applying the heat comprises applying the heat at a temperature of a eutectic point of the eutectic metal, causing the first component and the second component of the eutectic metal to react and form a liquid, and wherein the bond formed comprising the sealing layer between the plurality of conductive pads of the first semiconductor wafer and the plurality of conductive pads of the second semiconductor wafer comprises the eutectic metal.

4. The method according to claim 3, wherein forming the first component of the eutectic metal comprises forming Ge or Sn, wherein the second component of the eutectic metal comprises Cu, and wherein the bond formed comprising the sealing layer between the plurality of conductive pads of the first semiconductor wafer and the plurality of conductive pads of the second semiconductor wafer comprises CuGe or CuSn.

5. The method according to claim 1, wherein forming the sealing layer over the top surfaces of the first semiconductor wafer and the second semiconductor wafer comprises forming a first layer comprising a first component of a eutectic metal over the top surfaces of the first semiconductor wafer and the second semiconductor wafer, and forming a second layer comprising a second component of the eutectic metal over the first layer, wherein applying the heat comprises applying the heat at a temperature of a eutectic point of the eutectic metal, causing the first component and the second component of the eutectic metal to react and form a liquid, and wherein the bond formed comprising the sealing layer between the plurality of conductive pads of the first semiconductor wafer and the plurality of conductive pads of the second semiconductor wafer comprises the eutectic metal.

6. The method according to claim 5, wherein forming the first component of the eutectic metal comprises forming Al, wherein forming the second component of the eutectic metal comprises forming Ge, and wherein the bond formed comprising the sealing layer between the plurality of conductive pads of the first semiconductor wafer and the plurality of conductive pads of the second semiconductor wafer comprises AlGe.

7. The method according to claim 1, further comprising activating the top surfaces of the first semiconductor wafer and the second semiconductor wafer, after removing the sealing layer from over the insulating materials of the first semiconductor wafer and the second semiconductor wafer.

8. The method according to claim 7, wherein activating the top surfaces of the first semiconductor wafer and the second semiconductor wafer comprises a method selected from the group consisting essentially of a dry treatment, a wet treatment, a plasma treatment, exposure to an inert gas, exposure to $H_2$, exposure to $N_2$, exposure to $O_2$, and combinations thereof.

9. A hybrid bonding method for semiconductor wafers, the method comprising:
   providing a first semiconductor wafer and a second semiconductor wafer, the first semiconductor wafer and the second semiconductor wafer each having a plurality of conductive pads disposed within an insulating material on a top surface thereof;
   performing a chemical-mechanical polish (CMP) process on the top surfaces of the first semiconductor wafer and the second semiconductor wafer, wherein the CMP process forms recesses on top surfaces of the plurality of conductive pads;
   cleaning the top surfaces of the first semiconductor wafer and the second semiconductor wafer;
   forming a sealing layer over the top surfaces of the first semiconductor wafer and the second semiconductor wafer;
   removing the sealing layer from over the insulating material of the first semiconductor wafer and the second semiconductor wafer, leaving the sealing layer remaining in the recesses on the top surfaces of the plurality of conductive pads of the first semiconductor wafer and the second semiconductor wafer;
   coupling the top surface of the second semiconductor wafer to the top surface of the first semiconductor wafer;
   applying pressure to the first semiconductor wafer and the second semiconductor wafer to form a bond between the insulating materials of the first semiconductor wafer and the second semiconductor wafer; and
   heating the first semiconductor wafer and the second semiconductor wafer, wherein heating the first semiconductor wafer and the second semiconductor wafer forms a bond comprised of the sealing layer between the plurality of conductive pads of the first semiconductor wafer and the second semiconductor wafer.

10. The method according to claim 9, wherein the sealing layer left remaining in the recesses in the top surfaces of the plurality of conductive pads seals gaps between the plurality of conductive pads of the first semiconductor wafer and the second semiconductor wafer.

11. The method according to claim 9, wherein coupling the top surface of the second semiconductor wafer to the top surface of the first semiconductor wafer forms an aperture between the sealing layers in the recesses on the top surfaces of the plurality of conductive pads of the first semiconductor wafer and the second semiconductor wafer, and wherein heating the first semiconductor wafer and the second semiconductor wafer causes the sealing layers to liquefy and close the aperture between the sealing layers.

12. The method according to claim 9, wherein the sealing layer left remaining in the recesses in the top surfaces of the plurality of conductive pads prevents oxidation of the plurality of conductive pads of the first semiconductor wafer and the second semiconductor wafer.

13. The method according to claim 9, wherein cleaning the top surface of the first semiconductor wafer and the top surface of the second semiconductor wafer comprises reducing an amount of oxide material on the top surface of the first semiconductor wafer and the top surface of the second semiconductor wafer.

14. The method according to claim 13, wherein cleaning the top surface of the first semiconductor wafer and the top surface of the second semiconductor wafer comprises a method selected from the group consisting essentially of a thermal treatment, a plasma treatment, a wet treatment, a dry treatment, exposure to a gas comprising (about 4 to 10% $H_2$)/(about 90 to 96% inert gas or $N_2$), exposure to a gas comprising about 100% $H_2$, an introduction of an acid, and combinations thereof.

15. The method according to claim 9, wherein heating the first semiconductor wafer and the second semiconductor wafer comprises heating the first semiconductor wafer and the second semiconductor wafer to a temperature of about 150 to 650 degrees C.

16. The method according to claim 9, wherein applying pressure to the first semiconductor wafer and the second semiconductor wafer comprises applying a pressure of about 200 kPa or less.

17. A hybrid bonding method for semiconductor wafers, the method comprising:
   providing a first semiconductor wafer and a second semiconductor wafer, the first semiconductor wafer and the second semiconductor wafer each having a plurality of conductive pads disposed within an insulating material on a top surface thereof;
   forming a first layer of a sealing layer over the top surfaces of the first semiconductor wafer;
   forming a first layer of a sealing layer over the top surfaces of the second semiconductor wafer;
   forming a second layer of the sealing layer over the top surfaces of the first layer of the sealing layer on the first semiconductor wafer;
   forming a second layer of the sealing layer over the top surfaces of the first layer of the sealing layer on the second semiconductor wafer;
   removing the first layer of the sealing layer and the second layer of the sealing layer from over the insulating materials of the first semiconductor wafer and the second semiconductor wafer, respectively, leaving portions of the first layer of the sealing layer and the second layer of the sealing layer disposed over the respective plurality of conductive pads of the first semiconductor wafer and the second semiconductor wafer;
   coupling the top surface of the second semiconductor wafer to the top surface of the first semiconductor wafer; and
   applying heat and pressure to the first semiconductor wafer and the second semiconductor wafer, and forming a bond between the insulating material of the first semiconductor wafer and the insulating material of the second semiconductor wafers, and forming a bond comprising the sealing layer between the plurality of conductive pads of the first semiconductor wafer and the plurality of conductive pads of the second semiconductor wafer.

18. The method of claim 17, wherein applying the pressure forms a bond between the insulating material of the first semiconductor wafer and the insulating material of the second semiconductor wafers, and wherein applying the heat forms a bond comprising the sealing layer between the plurality of conductive pads of the first semiconductor wafer and the plurality of conductive pads of the second semiconductor wafer.

19. The method of claim 17, wherein the first layer of the sealing layer, on both the first semiconductor wafer and of the second semiconductor wafer comprises Al.

20. The method of claim 17, wherein the second layer of the sealing layer on both the first semiconductor wafer and of the second semiconductor wafer comprises Ge.

* * * * *